(12) United States Patent
Paugh et al.

(10) Patent No.: US 7,893,685 B2
(45) Date of Patent: Feb. 22, 2011

(54) RF METER WITH INPUT NOISE SUPPRESSION

(75) Inventors: Darrin L. Paugh, Rushville, IN (US); David E. Storvick, Indianapolis, IN (US)

(73) Assignee: Acterna LLC, Germantown, MD (US)

( * ) Notice: Subject to any disclaimer, the term of this patent is extended or adjusted under 35 U.S.C. 154(b) by 1206 days.

(21) Appl. No.: 11/467,644

(22) Filed: Aug. 28, 2006

(65) Prior Publication Data

US 2008/0048882 A1    Feb. 28, 2008

(51) Int. Cl.
G01R 1/20 (2006.01)
(52) U.S. Cl. .................................................. 324/126
(58) Field of Classification Search ................ 324/116, 324/110, 126, 158.1, 103, 127, 117 H, 117 R, 324/96; 361/654, 672; 340/870.01, 870.02
See application file for complete search history.

(56) References Cited

U.S. PATENT DOCUMENTS

| | | | |
|---|---|---|---|
| 4,146,854 A | 3/1979 | Ishino et al. | 333/81 R |
| 4,656,451 A | 4/1987 | Pomponio | 336/96 |
| 4,972,167 A | 11/1990 | Fujioka | 336/92 |
| 5,091,707 A | 2/1992 | Wollmerschauser et al. | 333/12 |
| 5,162,772 A | 11/1992 | May | 336/92 |
| 5,287,074 A | 2/1994 | Meguro et al. | 333/12 |
| 5,334,955 A | 8/1994 | Strnad | 333/12 |
| 5,413,504 A | 5/1995 | Kloecker et al. | 439/620.03 |
| 5,990,756 A | 11/1999 | France, Jr. et al. | 333/12 |
| 6,053,744 A | 4/2000 | Gray et al. | 439/63 |
| 6,064,721 A | 5/2000 | Mohammadian et al. | 379/21 |
| 6,139,364 A | 10/2000 | Beutler et al. | 439/607 |
| 6,250,952 B1 | 6/2001 | Shiga et al. | 439/466 |
| 6,384,591 B1 | 5/2002 | Estep et al. | 324/111 |
| 6,385,300 B1 | 5/2002 | Mohammadian et al. | 379/21 |
| 6,575,762 B2 | 6/2003 | Evans | 439/63 |
| 6,590,963 B2 | 7/2003 | Mohammadian et al. | 379/21 |
| 6,738,454 B2 | 5/2004 | Mohammadian et al. | 379/21 |
| 6,894,582 B2 | 5/2005 | Whybrew et al. | 333/33 |
| 6,901,292 B2 | 5/2005 | Hrdlicka et al. | 607/27 |
| 6,917,595 B2 | 7/2005 | Chang et al. | 370/248 |
| 6,964,579 B2 | 11/2005 | Seminara et al. | 439/352 |
| 6,965,375 B1 | 11/2005 | Gettemy et al. | 345/173 |
| 6,980,089 B1 | 12/2005 | Kline | 375/258 |

(Continued)

FOREIGN PATENT DOCUMENTS

JP    07183686    7/1995

(Continued)

OTHER PUBLICATIONS

"SDA Series, Stealth Digital Analyzer, Operation Manual [Online]", Anonymous, May 2001, Pages: Front Page, XXI-XXIV, 9-33, 335-342. Retrieved from Internet: URL: http://www.trs-rentelco.com/Manual/WAV_SDA-5510_Manuel.pdf.

Primary Examiner—Minh N Tang
Assistant Examiner—Trung Q Nguyen
(74) Attorney, Agent, or Firm—Matthew A. Pequignot; Pequignot + Myers LLC (57) ABSTRACT

The invention provides a handheld RF meter with an improved isolation from EMI. The meter incorporates an interference barrier comprising a connecting cable and one or more ferrite cores possibly having different impedance characteristics.

18 Claims, 6 Drawing Sheets

U.S. PATENT DOCUMENTS

| | | |
|---|---|---|
| 6,987,837 B1 | 1/2006 | Blank et al. ................. 379/1.01 |
| 7,007,209 B2 | 2/2006 | Jaworski ..................... 714/716 |
| 7,009,484 B2 | 3/2006 | Gray et al. .................. 336/192 |
| 7,010,730 B1 | 3/2006 | Jaworski et al. ............. 714/704 |
| 7,012,496 B2 | 3/2006 | Sugiura et al. ................ 336/92 |
| 7,023,389 B2 | 4/2006 | Demicco et al. ............. 343/702 |
| 7,038,899 B2 | 5/2006 | Hsu et al. ................... 361/118 |
| 7,102,478 B2 * | 9/2006 | Pridmore et al. ............ 336/176 |
| 7,417,554 B2 * | 8/2008 | Benke et al. ................ 340/638 |
| 2002/0150217 A1 | 10/2002 | Haines .................... 379/22.02 |
| 2004/0208293 A1 | 10/2004 | Mohammadian et al. ...... 379/21 |
| 2005/0144648 A1 | 6/2005 | Gotwals et al. ............. 725/111 |
| 2005/0282433 A1 | 12/2005 | Pixley et al. ................ 439/578 |

FOREIGN PATENT DOCUMENTS

| | | |
|---|---|---|
| JP | 2001244685 | 9/2001 |
| JP | 2004127533 | 4/2004 |

* cited by examiner

RF METER WITH INPUT NOISE SUPPRESSION

TECHNICAL FIELD

The present invention relates to measuring a signal in a communication system. In particular, the invention relates to handheld devices for RF signal monitoring and methods for providing isolation from interfering broadcast RF signals.

BACKGROUND OF THE INVENTION

A handheld RF meter is an important tool used by field network technicians to test cable modem services, digital video, analog video, and VoIP signals. The RF meter, when connected to a coaxial cable of a cable network, acts as a customer's modem enabling the validation of network services available to the customer. The testing may involve monitoring ongoing traffic, injection of predetermined test messages to monitor the system's response, measuring operational parameters, such as bit error rates, message travel times and the like, or monitoring the operation of individual components of the system.

The accuracy of such meters may be affected by the presence of an external electro-magnetic (EM) field surrounding the coaxial cable of the system being analyzed. The external electro-magnetic field induces electrical currents in an external conducting sheath, also referred to as a cable shield, of the coaxial cable. The induced electrical currents, or sheath currents, may interfere with an electro-magnetic signal propagating via a signal conductor of the cable, resulting in signal distortions and noise.

Major sources of the external EM field that can be present around an RF meter are broadcast Radio and TV signals. The over-the-air broadcast signals may affect readings of the RF meter because of a frequency overlap between the broadcast and cable TV signals. For example: the cable channel 86 has a frequency bandwidth of 595.25 MHz-599.75 MHz; and the adjacent broadcast channel 35 has a frequency bandwidth of 596 MHz-602 MHz. Thus, the Audio and Video portions of these two signals are overlapped. The similar overlap affects multiple channels across the entire spectrum from 54 MHz-890 MHz.

The electro-magnetic interference (EMI) due to the radio- and TV-broadcast may not significantly affect readings of an RF meter if there is a substantial difference in signal power, i.e. when a cable signal to be measured is significantly stronger than the interfering broadcast signal. However, TV broadcast providers have been incrementally increasing power of the over-the-air transmissions to maintain quality of the signal provided to the growing customer base over an increasing area, thus increasing the power level of the EMI signal and its effect on the cable TV signal measurements.

Furthermore, the advance of the digital TV and HDTV has increased the importance of accurate RF measurements of cable TV signals, including measurements of such parameters as modulation error rate (MER) and bit error rate (BER). The sensitivity of the digital TV signal to EMI compounds the impact of the high-power TV broadcast on the cable TV monitoring. The imminent transition of the majority of TV channels to digital format adds to the need for reliable EMI suppression in devices for monitoring cable TV signals.

An object of the present invention is to provide a handheld RF meter with an improved isolation from EMI.

SUMMARY OF THE INVENTION

The invention provides a convenient and cost-effective solution to the problem of monitoring cable TV signals using RF meters in the presence of EMI.

In accordance with one aspect of this invention, a handheld RF meter is provided with an improved isolation from EMI.

Another aspect of the invention provides a meter for monitoring an RF signal received from a network cable, comprising: a casing; a printed circuit board (PCB) disposed inside the casing, the PCB having RF circuitry for monitoring the RF signal; an input RF connector affixed to the casing for receiving the network cable, a connecting RF cable extending between the input RF connector and the PCB for providing the RF signal to the PCB; and a first ferrite core coupled to the connecting RF cable so that the connecting RF cable passes therethrough, for attenuating interference signals transmitted via a conducting sheath of the network cable.

In one embodiment of the invention, the meter is an RF meter for testing and/or monitoring cable TV signals.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
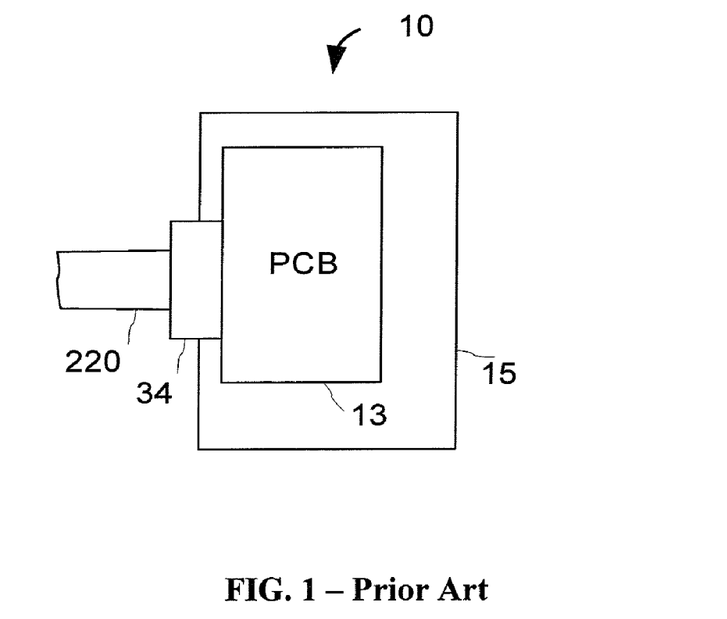
FIG. 1 is a schematic diagram of an RF input arrangement of a prior art RF meter.
Figure 2:
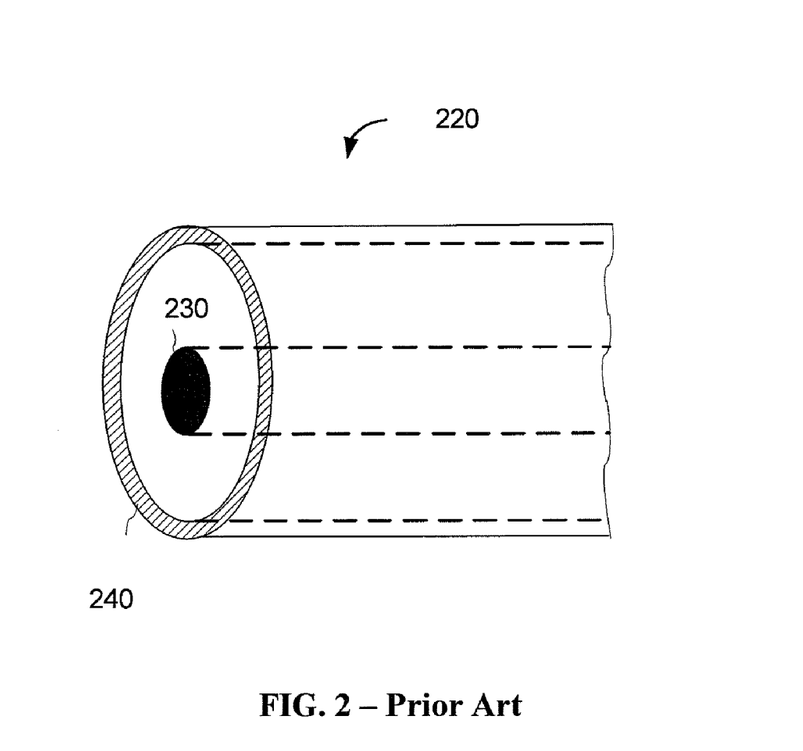
FIG. 2 is a cross-section of a coaxial cable external to a meter.

FIG. 1 schematically illustrates an RF input arrangement of a prior art RF meter 10. The RF meter 10 has a casing 15, which is preferably made with metal for providing a shield against external electromagnetic fields, and which houses a printed circuit board (PCB) 13 containing input RF circuitry. An input RF connector 34 is attached to the casing 15 for receiving a connectorized end of a coaxial cable 220, which is shown in FIG. 2 in cross-section. Conventionally, the input RF connector 34 is directly attached to the PCB 13 in a direct electrical contact therewith, so that a signal conductor 230 of the external coaxial RF cable 220 is connected to an input signal line of the PCB 13, and the external conducting sheath 240 of the coaxial cable 220 is electrically connected to a ground plane of the PCB 13 via a ground contact portion of the input connector 34.

In operation, cable TV signals delivered by the RF cable 220 are received by the RF meter 10 via the input connector 34 and processed by the RF electronics mounted on the PCB 13. The close electrical contact between the external conducting sheath 240 of the coaxial cable 220 and the ground plane of the PCB 13 via the ground portion of the input connector 34 provides a direct low-loss path for sheath currents, e.g. those induced in the network cable 220 by over-the-air RF signals, to couple into the RF circuitry of the meter 10, thereby affecting an electrical potential of the PCB 13 ground plane, and compromising the accuracy of measurements performed by the meter 10. Disadvantageously, recent spread of HDTV significantly increased the occurrence and intensity of the interfering high-frequency sheath currents in coaxial cables of TV networks, resulting in many cases in inaccurate readings of cable TV signals obtained by technicians in the field using the prior-art RF meters.

It has been known to suppress EMI-induced noise in external TV antenna cables and power and data computer cables using ferrite cores, or beads, mounted on the cables near entrance points of the respective devices. Such a wire or cable can act as an antenna by either receiving or transmitting other unwanted frequencies. Ferrite, as magnetic substance, fitted onto the electric cable, e.g. in the form of ferrite beads or ferrite cores having a tubular structure, absorbs the high-frequency RF noise. Large variety of ferrite noise suppressors are available commercially, and are typically manufactured in geometries which use about one cubic inch of ferrous oxide material cast into various cylindrical or rectangular shapes. A hole is provided in the ferrite suppressor through which a cable or wire can pass. They can have a snap-on configuration simplifying their use for TV antenna cables and computer power and data cables. Various configurations of ferrite cores for noise suppression are disclosed in U.S. Pat. Nos. 5,287,074, 5,162,772, 4,972,167, 4,656,451, and 4,146,854.

For example, U.S. Pat. No. 4,972,167 discloses a ferrite electric noise absorber comprising magnetic substance that is shaped to surround the periphery of an electric cable, and an openable case that is composed of two case members for containing the magnetic substance. When the case is fitted onto the electric cable of the electronic device, the electric noise absorber attenuates the electric noise on the electric cable.

Figure 3:
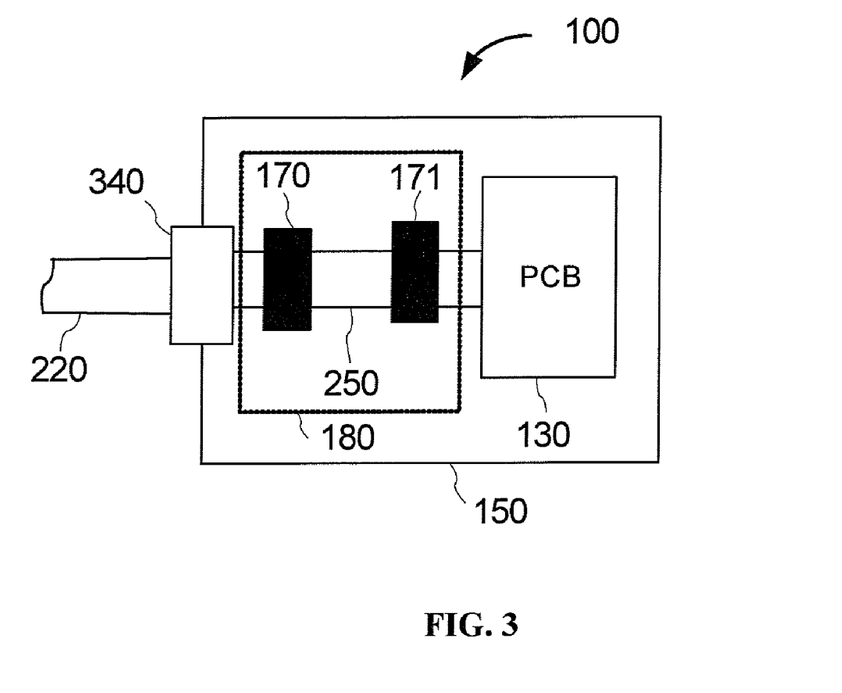
FIG. 3 is a schematic diagram of an RF input arrangement of an RF meter according to the present invention.
Figure 4:
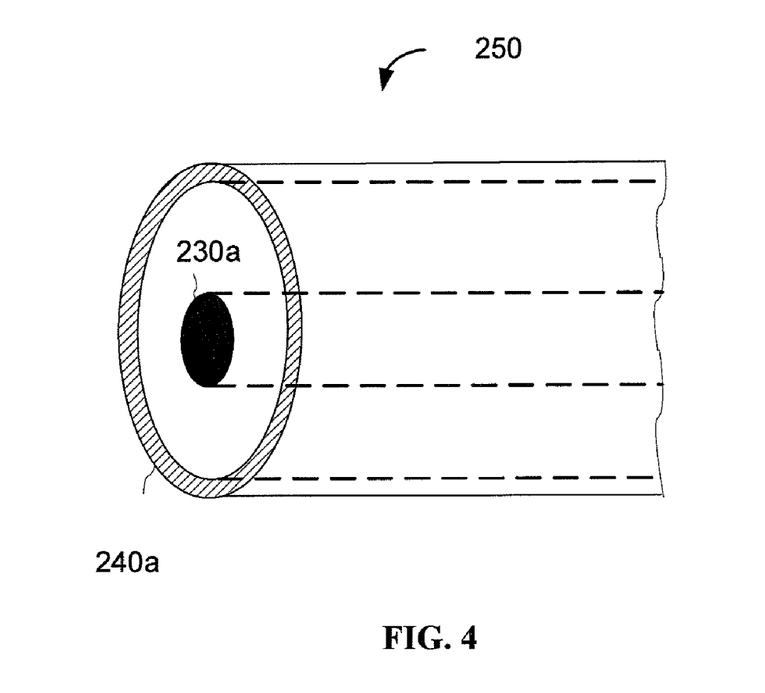
FIG. 4 is a cross-section of a connecting cable internal to a meter.

Ferrite beads for suppressing high-frequency electromagnetic noise may be formed in accordance with known techniques and are commercially available in a variety of shapes and sizes. The present invention utilizes ferrite beads suitably configured to reduce electromagnetic interference associated with the connecting cable 250 in accordance with known methods.

Accordingly, a possible solution to the aforedescribed EMI associated problem of monitoring the cable TV signals using the portable RF meters would be to suppress the sheath currents before they reach the RF meter 10 by mounting a suitable ferrite bead onto the network TV cable 220 prior to the input RF connector 34 before performing the TV signal measurements with the RF meter 10. However, this would cause an inconvenience for field technicians attending multiple locations during a day, by requiring them to perform an additional operation before performing each cable TV signal testing, thereby decreasing their productivity. Additionally, it would disadvantageously affect reliability of the tests, since there would be difficult to ensure that a ferrite bead was indeed used for each particular test. Furthermore, responding to a regular use of ferrite beads with the meters, manufacturers would have to ship ferrite beads with each meter, and cover their application in manuals and training courses. Altogether, using external ferrite beads with RF meters for measuring cable TV signals and the like would result in the inconvenience for technicians and significant additional cost.

The present invention provides a convenient and cost-effective solution to the aforedescribed interference problem without requiring any additional measurement steps from the user, by providing an RF meter for testing and/or monitoring the cable TV signals and the like that incorporates the ferrite noise suppressors therewithin. More particularly, the invention spatially separates the input RF connector 34 of the RF meter 10 from the internal PCB 13, by inserting an interference barrier therebetween that prevents the noisy RF sheath currents induced in the conducting sheath of the TV cable 220 by the external RF fields from coupling onto the PCB 13 of the meter 10.

A preferred embodiment of a handheld RF meter with an improved isolation from EMI is shown in FIGS. 3-9, wherein like elements are shown using like numerical labels, and is hereafter described.

FIG. 3 schematically shows an RF input arrangement of an RF meter 100 according to the present invention. Similarly to the RF meter 10 shown in FIG. 1, the RF meter 100 has a casing 150 housing a PCB 130, wherein the RF circuitry of the RF meter 100 resides. An input RF connector 340, which accepts the external RF cable 220 carrying the RF signal to be tested, is mounted to the casing 150 of the meter 100. Electrical and physical design of the PCB 130 can be identical to that of the PCB 13 of the prior-art RF meter 10, as the EMI isolation is achieved in the invention without requiring any PCB-level changes to the RF circuitry of the RF meter 100.

Advantageously, and contrary to the prior-art RF input arrangement of the RF meter 10 shown in FIG. 1, the input RF connector 340 and the PCB 130 are spatially separated, using an interference-suppressing cable assembly 180. The assembly 180 comprises a connecting RF cable 250, shown in cross-section in FIG. 4, and at least one ferrite core 170 mounted around the periphery of said cable 250 for suppressing the EMI-related RF currents that are coupled into a conducting sheath 240a of the connecting cable 250, e.g. via the input RF connector 340. The ferrite cores 170 and 171 are suitably configured, as would be known to those skilled in the art, to reduce the electromagnetic interference associated with the sheath currents in the connecting cable 250 in the frequency range 54-890 MHz.

Figure 5:
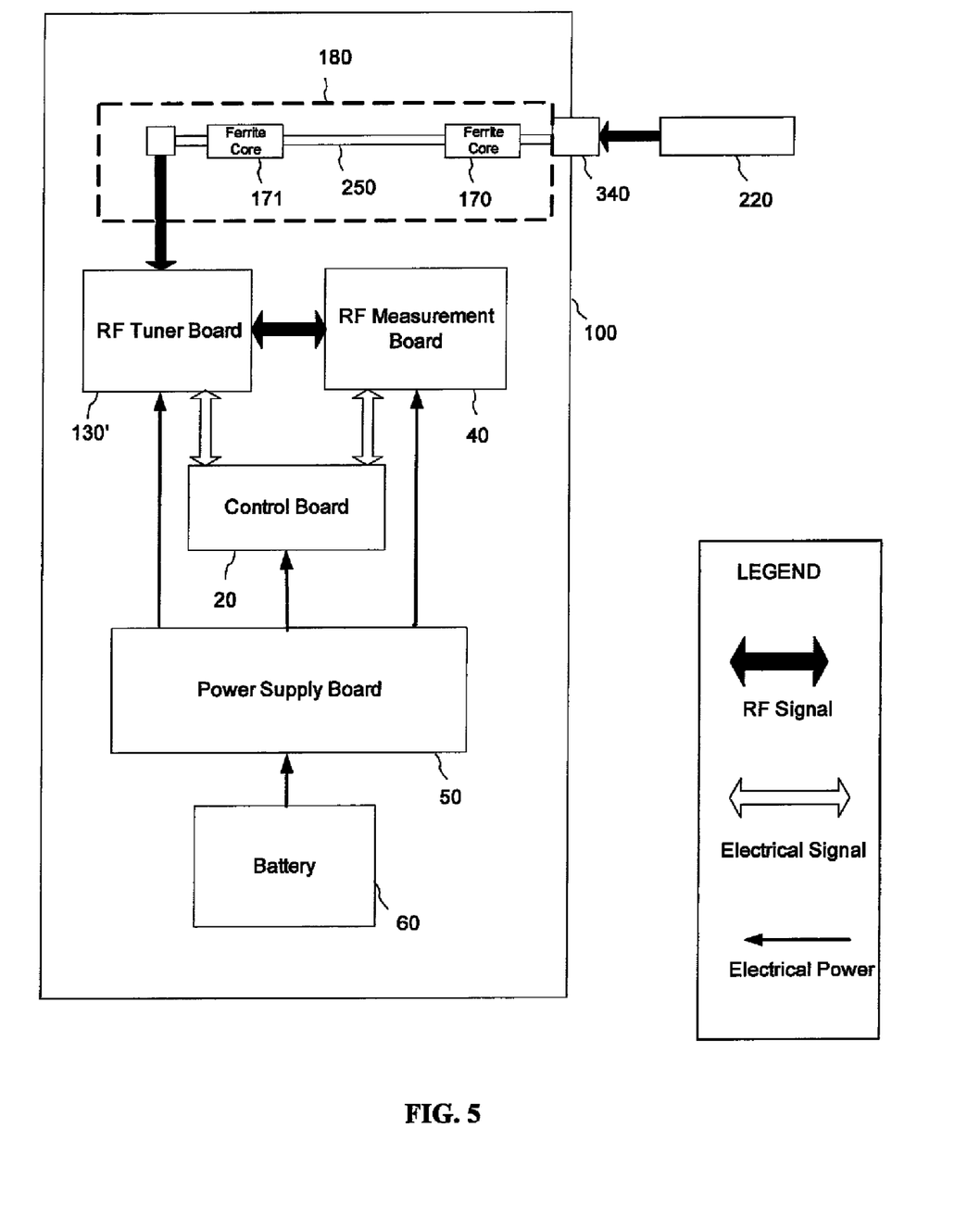
FIG. 5 is a block diagram of an RF meter according to the present invention.

FIG. 5 is a block diagram of the RF meter 100 according to one embodiment of the present invention. The input RF connector 340 of the meter 100 receives an RF signal provided to the meter 100 via the external TV cable 220. The interference-suppressing cable assembly 180 conveys the received RF signal to the PCB 130' while providing isolation from EMI-related noise. The PCB 130' contains input RF circuitry including an RF tuner for tuning to a frequency range of a monitored TV channel. An RF measurement board 40 includes RF circuitry for monitoring of the received RF signal, e.g. it can perform the following measurements: analog video and audio signal levels, digital video and audio signal levels, digital channel modulation error rate (MER), digital channel bit error rate (BER), DOCSIS and VOIP measurements. The RF boards 130' and 40 may include digital to analogue converters for converting digital control signals from a control board 20 into analogue control signals. The digital control board 20, which preferably includes a digital processor unit, controls operations of the meter 100 and can be used to assist in the processing of the RF signal measurements. The meter 100 also includes a power supply board 50 that provides power to the circuits within the meter 100. The power supply board 50 can receive power from a battery pack 60 or an external power supply source.

Alternatively, input circuitry 130' and RF measurement circuitry 40 can be implemented on one or more PCBs within the meter 100.

Other components and subcomponents of the meter 100 should be apparent to someone skilled in the art.

Operations of the interference-suppressing cable assembly 180 will be described hereinafter in reference to FIGS. 3 and 4. In operation, an input RF signal under test is coupled into the RF meter 100 from the network cable 220 via the input RF connector 340. A noise signal induced in the external sheath 240 of the network cable 220 by an external electro-magnetic field, e.g. an HDTV broadcast signal, may be coupled into the meter from the cable 220 together with the input signal. From the connector 340, the input signal and the possible noise signal are received by the interference-suppressing cable assembly 180. The input RF signal is transmitted via the signal conductor 230a of the connecting RF cable 250 to the PCB 130, wherein the RF signal is measured. The EMI-induced RF noise signal carried by the sheath currents in the external sheath 240a of the connecting cable 250 generates an associated RF electromagnetic field, which is impeded due to the permeability of the ferrite material in the cores 170 and 171. Diminishing of the electromagnetic field associated with the sheath current, in turn, attenuates the sheath current itself. Therefore, before reaching the PCB 130, the noise signal carried by the sheath current is attenuated by the ferrite cores 170 and 171 disposed around the cable 250. The ferrite cores 170 and 171 increase the common-mode inductance on the cable 250, and that suppresses the EMI-induced RF currents on the cable shield 240 of the external cable 220.

Figure 6:
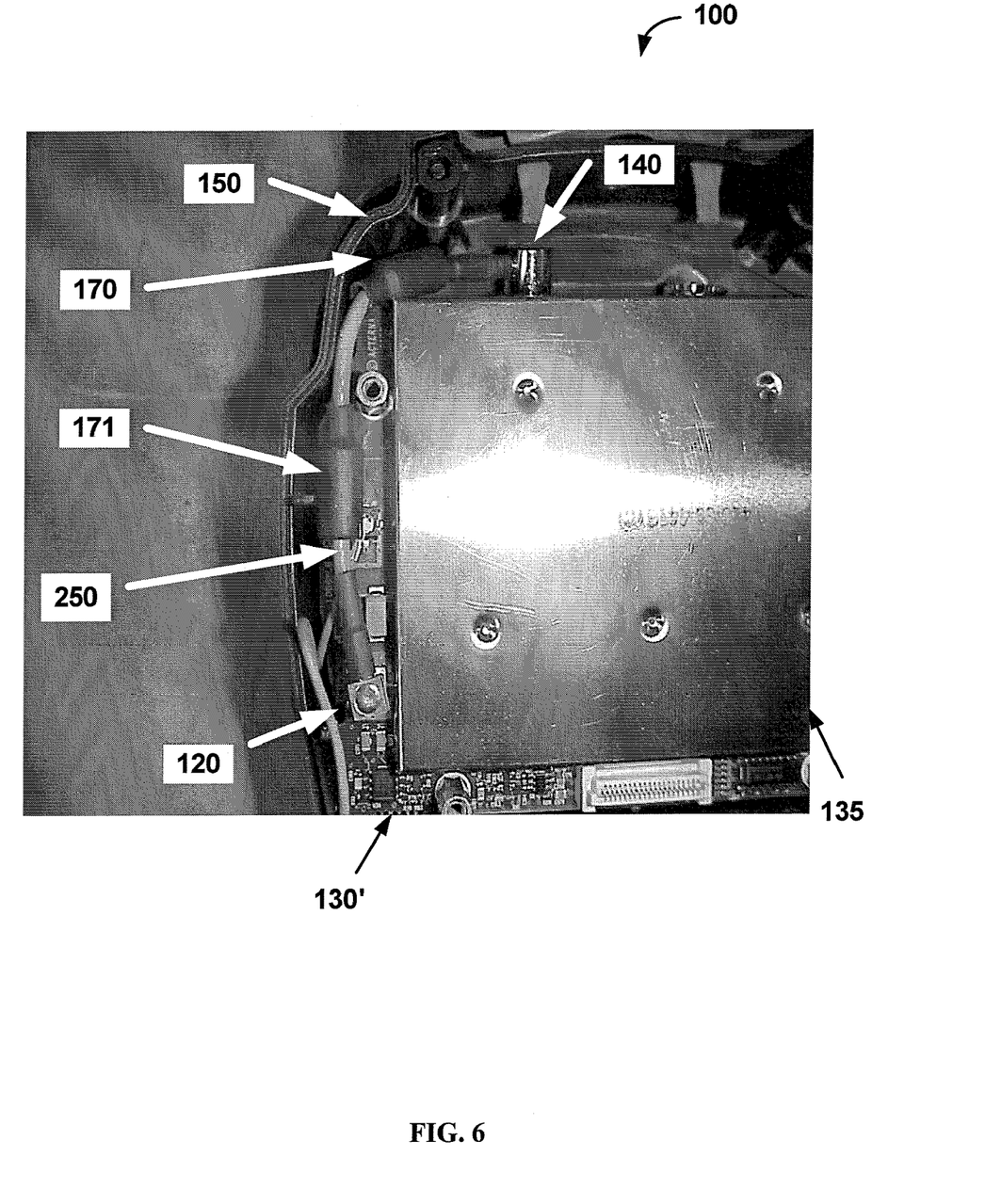
FIG. 6 is a photograph of a portion of an RF meter according to the preferred embodiment of the present invention, with an open cover, showing the internal connecting RF cable.

FIG. 6 is a photograph of the preferred embodiment of the present invention commercially produced by JDSU as a DSAM series product. The photograph shows a partial internal view of the RF meter 100 with a top portion of the casing 150 removed. The connecting cable 250 has a connector 140 at one end thereof for connecting to the input RF connector 340, and a connector 120 for connecting to the PCB 130' at the other end thereof. Two ferrite cores 170 and 171 are shown attached to the connecting cable 250.

By way of example, the beads (cores) 170 and 171 are designed to cumulatively provide at least 200 ohm impedance or larger in the frequency range of the sheath currents from 50 MHz up to 1 GHz. Each of the beads 170 and 171 is a one-piece core, made of Nickel Zinc Ferrite. The external and internal diameters of each core are about 8 mm and 4 mm correspondingly, and the length is about 12 mm. A metallic composition for each of the cores 170 and 171 is such, that said cores cumulatively provide a predetermined level of performance across a frequency spectrum. The cores 170 and 171 are disposed apart from one another at the ends of the cable 250, which has a 75 ohm impedance and an overall length of approximately 10 cm. Preferably, the cores 170 and 171 are installed during the manufacture of the cable 250 prior to the installation of the end connectors 120 and 140, and held in place with a heat shrink tube.

Other embodiments employ a number of ferrite beads other than two. In some embodiments, it may be preferable to use more ferrite material, by increasing either the number or the size of the ferrite beads, to provide stronger EMI suppression. Furthermore, the number of beads and their placement may be limited by mechanical considerations of the handheld device. A skilled technician would be able to determine a preferred bead configuration for each particular device configuration, to provide a required EMI suppression within a given frequency range while accounting for a particular device size, weight and geometry limitations.

In one embodiment of the present invention, the ferrite beads/cores attached to the cable 250 differ from each other in size and/or shape. Depending on their size and shape, some cores have a higher impedance characteristics at higher frequencies, and other cores—at lower frequencies. Combining suitably different cores together on one cable provides a high impedance level achieved over a wide frequency range. The "mix and match" concept allows to customize the EMI suppression performance characteristics over a wide range of products, so as to protect various products from a spectrum of EMI sources.

For example, in one embodiment the two ferrite cores 170 and 171 that are attached to the cable 250 suitably differ from each other in their frequency responses, so that an impedance curve of a first core 170 peaks at about 250 MHz, whereas an impedance curve of a second core 171 peaks at about 750 MHz, providing the overall impedance of the assembly 180 around 200 ohms across the 54 MHz-890 MHz frequency range.

Spatial parameters of the interference-suppressing cable assembly 180 and a location of the connector 120 on the PCB 130 are chosen, in particular, to provide enough space for ferrite material around the cable 250, and depend on geometry of the meter 100. Preferably a length of the cable 250 is at least 8 cm including connectors in order to accommodate the one or more ferrite cores used for EMI suppression.

By way of example, the connecting cable 250 is a flexible coaxial RF cable between 8 and 12 cm long, characterized by a 75 ohm impedance to match an impedance of the network cable 220, e.g. a an RG6 cable. In one embodiment, connectors 120 and 140 are Acterna P/N 2111-00-0009 and Acterna P/N 2110-00-3035 connectors respectively.

Figure 7:
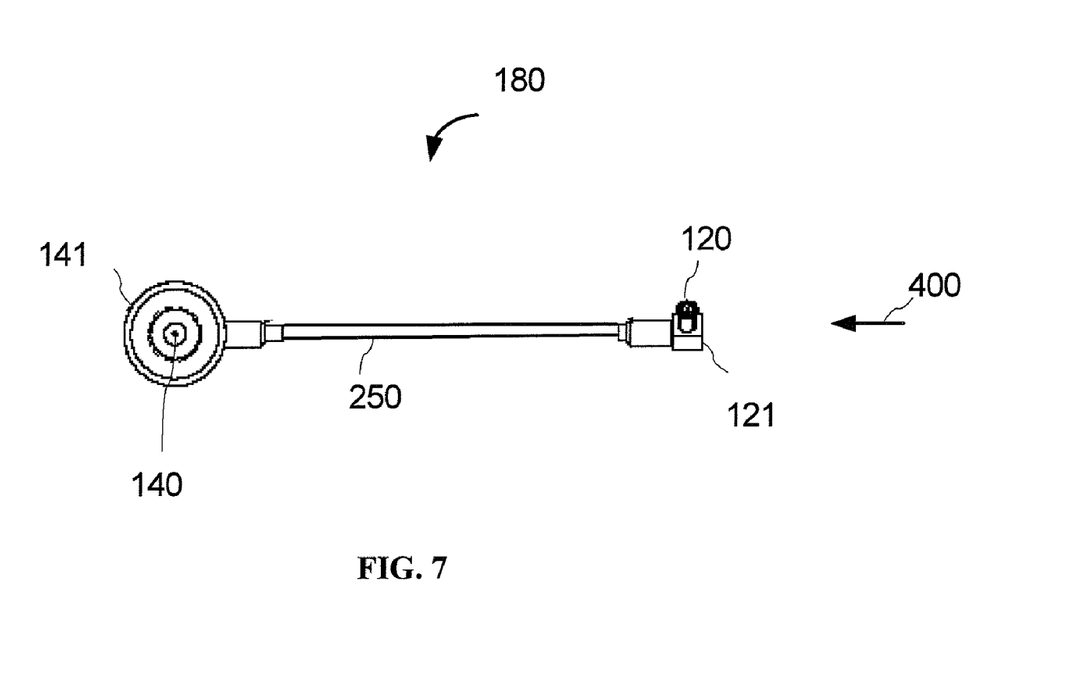
FIG. 7 is a diagram of a connecting cable according to the preferred embodiment of the present invention.

In another embodiment, the internal RF connector 120 has a ground portion 121, shown in FIG. 7, in direct contact with a ground plane of the PCB for grounding the connecting cable 250. The ground plane of the PCB involves shielding 135 that covers 90% of the PCB 130' as shown in FIG. 6, as well as ground planes within the board itself. The PCB 130' comprises four layers. Layer 2, internal to the board, is a complete ground plane that makes contact with isolated ground planes on the remaining three layers with barreled vias. The isolated ground planes on the aforementioned three layers are strategically placed due to RF characteristics dependent upon circuits involved. The ground portion of the interference-suppressing cable assembly 180 includes housings 121 and 141 of the two end connectors 120 and 140, shown in FIG. 7, as well as a ground braid within of the external sheath 240a of the cable 250. The direct contact of ground portion 121 of the internal RF connector 120 with ground plane of the PCB provides grounding of the connecting cable 250.

In other embodiments, connector 120 is one taught in U.S. Pat. No. 6,575,762 issued to Evans, or in U.S. Pat. No. 6,053,744 issued to Gray et al., incorporated herein by reference.

Figure 8:
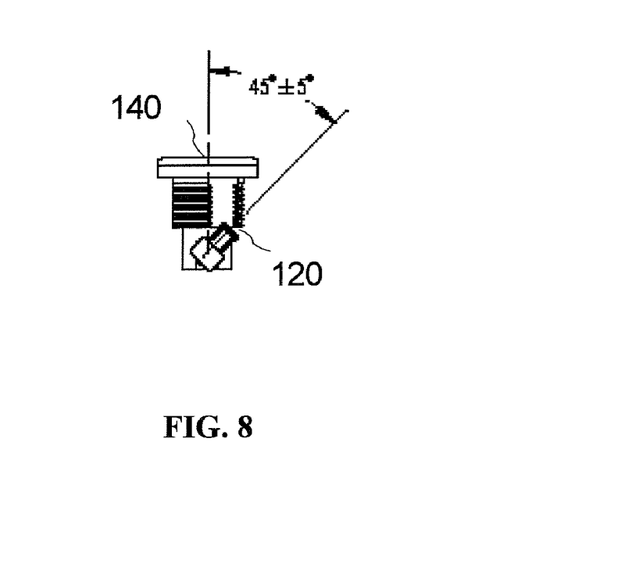
FIG. 8 is a side view of the connecting cable shown in FIG. 7.
Figure 9:
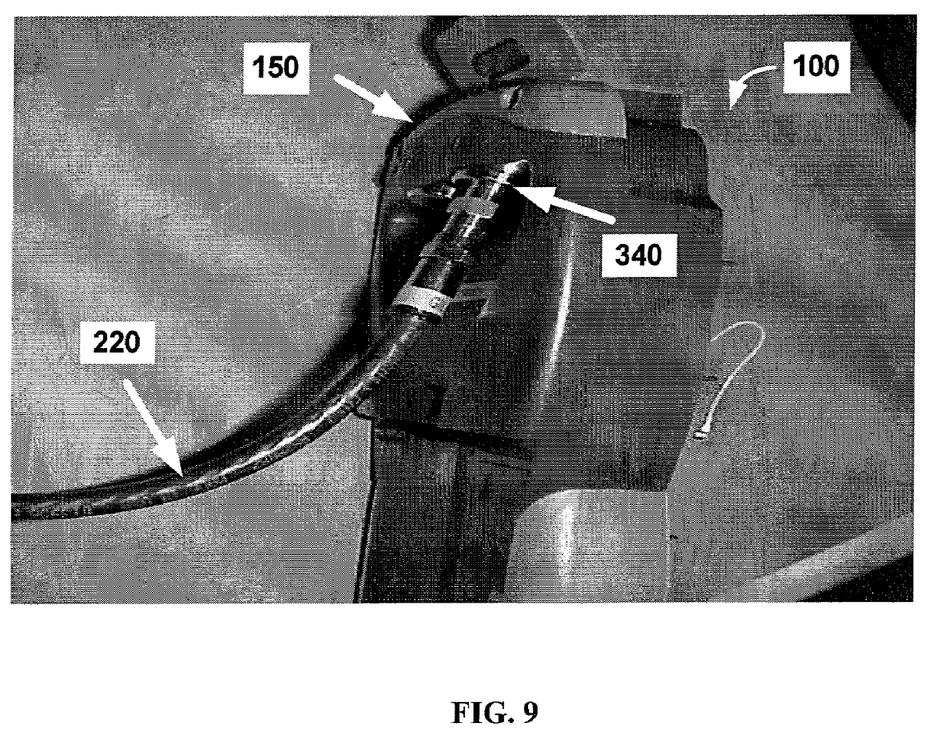
FIG. 9 is a photograph showing an external view of an RF meter with the connecting cable shown in FIGS. 7 and 8.

In the preferred embodiment, connectors 140 and 120 are attached to the cable 250 at an angle to each other as shown in FIGS. 7 and 8. FIG. 8 provides a side view of the cable 250 shown in FIG. 7, as seen from the direction pointed by an arrow 400. Preferably this angle is about 45°+/−5°. FIG. 9 is a photograph showing an external view of the RF meter 100 according to this embodiment.

Advantageously, the aforedescribed solution of the present invention to the problem of cable TV signals monitoring using RF meters in the presence of EMI is transparent to the user, since the interference barrier resides inside the meter; it is also convenient to manufacturers since it does not compromise the integrity of the RF path and of the grounding scheme, and does not require any changes to the circuit design of the PCB 13.

Another advantage of the present invention is that it not only enables the ferrite cores to be permanently installed within the casing, but also allows to distance the input connector 340 from the PCB for any design reason.

Yet another advantage of the present invention is that the ferrite cores 170 and 171 around the cable 250 also suppress sheath currents that are associated with the internal to the meter EMI, e.g. a sheath current induced in the cable 250 by the PCB circuitry.

In the preferred embodiment of the present invention the network cable 220 and the connecting cable 250 are round coaxial TV cables. However, one skilled in the art would appreciate that the present invention is applicable to RF meters for measuring RF signals carried by other types of RF cables having an external conducting sheath.

It should be understood that the spatial parameters of the assembly 180 as well as a number, shape and material of cores may vary without departing from the spirit of the present invention. Of course numerous other embodiments of the invention may be envisioned without departing from the spirit and scope of the invention.

We claim:

1. A meter for monitoring an RF signal received from a network cable, comprising:
   a casing;
   a printed circuit board (PCB) disposed inside the casing, the PCB having RF circuitry for monitoring the RF signal;
   an input RF connector affixed to the casing for receiving the network cable,
   a connecting RF cable extending between the input RF connector and the PCB for providing the RF signal to the PCB; and
   a first ferrite core coupled to the connecting RF cable so that the connecting RF cable passes therethrough, for attenuating interference signals transmitted via a conducting sheath of the network cable.

2. A meter according to claim 1, further comprising a second ferrite core coupled to the connecting RF cable so that the connecting RF cable passes therethrough.

3. A meter according to claim 2, wherein the first and second ferrite cores are designed to cumulatively provide at least 200 ohm impedance for interference signals in a frequency range from 50 MHz up to 1 GHz.

4. A meter according to claim 2, wherein the first and second ferrite cores have differing frequency responses.

5. A meter according to claim 2, wherein the first ferrite core has an impedance that peaks at about 250 MHz and the second ferrite core has an impedance that peaks at about 750 MHz.

6. A meter according to claim 2, wherein the first and second ferrite cores are disposed at the ends of the connecting RF cable.

7. A meter according to claim 2, wherein the connecting RF cable is connected to the PCB via an internal RF connector having a ground portion in direct contact with a ground plane of the PCB.

8. A meter according to claim 1, wherein the first ferrite core is held in place with a heat shrink tube.

9. A meter according to claim 1, wherein the connecting RF cable include RF connectors attached at the ends thereof.

10. A meter according to claim 9, wherein the connecting RF cable is at least 8 cm long.

11. A meter according to claim 9, wherein the connecting RF cable is between 8 cm and 12 cm long.

12. A meter according to claim 1, wherein the connecting RF cable is fully internal to the casing.

13. A meter according to claim 1, wherein the network cable is a coaxial cable of a cable TV network, and the RF signal is a cable TV signal provided therein.

14. A meter according to claim 1, wherein the connecting RF cable comprises a coaxial cable.

15. A meter according to claim 1, wherein an impedance of the connecting RF cable is substantially 75 ohm.

16. A meter according to claim 1, wherein the casing is sized to be held in a human hand.

17. A meter according to claim 1, wherein the first ferrite core comprises Nickel Zinc Ferrite material.

18. A meter according to claim 1, wherein the first ferrite core has an external diameter about 8 mm, internal diameter about 4 mm, and a length about 12 mm.

* * * * *